United States Patent
Kang et al.

(10) Patent No.: US 9,028,975 B2
(45) Date of Patent: May 12, 2015

(54) ORGANIC LIGHT-EMITTING DEVICE HAVING LIGHT-EMITTING PATTERN, METHOD AND APPARATUS FOR PREPARING THE SAME

(75) Inventors: Min-Soo Kang, Daejeon Metropolitan (KR); Yun-Hye Hahm, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 1092 days.

(21) Appl. No.: 12/226,953

(22) PCT Filed: May 3, 2007

(86) PCT No.: PCT/KR2007/002183
§ 371 (c)(1),
(2), (4) Date: Nov. 3, 2008

(87) PCT Pub. No.: WO2007/129834
PCT Pub. Date: Nov. 15, 2007

(65) Prior Publication Data
US 2009/0079339 A1 Mar. 26, 2009

(30) Foreign Application Priority Data

May 4, 2006 (KR) .................. 10-2006-0040640
Oct. 17, 2006 (KR) .................. 10-2006-0100783

(51) Int. Cl.
| | | |
|---|---|---|
| H01J 1/62 | (2006.01) |
| H01J 9/00 | (2006.01) |
| H05B 33/10 | (2006.01) |
| C09K 11/06 | (2006.01) |
| H01L 27/32 | (2006.01) |
| H01L 51/00 | (2006.01) |
| H01L 51/50 | (2006.01) |
| H01L 51/52 | (2006.01) |
| H05B 33/14 | (2006.01) |
| H01L 51/56 | (2006.01) |

(52) U.S. Cl.
CPC ......... *C09K 11/06* (2013.01); *C09K 2211/1044* (2013.01); *H01L 27/3239* (2013.01); *H01L 51/0015* (2013.01); *H01L 51/0023* (2013.01); *H01L 51/0071* (2013.01); *H01L 51/0072* (2013.01); *H01L 51/0076* (2013.01); *H01L 51/5088* (2013.01); *H01L 51/5203* (2013.01); *H01L 51/56* (2013.01); *H05B 33/14* (2013.01)

(58) Field of Classification Search
None
See application file for complete search history.

(56) References Cited

U.S. PATENT DOCUMENTS 6,459,199 B1 * 10/2002 Kido et al. .................. 313/504
6,833,854 B1   12/2004 Sandstrom
(Continued)

FOREIGN PATENT DOCUMENTS

CN    1123278      10/2003
EP    1071145 A2    1/2001
(Continued)

*Primary Examiner* — J. L. Yang
(74) *Attorney, Agent, or Firm* — McKenna Long & Aldridge LLP

(57) ABSTRACT

Disclosed is a method of producing an organic light emitting device, an organic light emitting device produced by using the method, and an apparatus used in the method. The method includes preparing a first electrode, forming one or more organic material layers on the first electrode, and forming a second electrode on the organic material layers, wherein the method includes changing functions of predetermined pattern regions of one or more layers of the organic material layers or the electrodes.

12 Claims, 4 Drawing Sheets

(56) References Cited

U.S. PATENT DOCUMENTS

| | | | |
|---|---|---|---|
| 2001/0022497 A1* | 9/2001 | Aoki et al. | 313/507 |
| 2002/0158242 A1* | 10/2002 | Son et al. | 257/40 |
| 2003/0057827 A1 | 3/2003 | Kido et al. | |
| 2004/0077250 A1 | 4/2004 | Miyadera et al. | |
| 2004/0113547 A1 | 6/2004 | Son et al. | |
| 2004/0137268 A1* | 7/2004 | Igarashi et al. | 428/690 |
| 2005/0130548 A1 | 6/2005 | Kubota | |
| 2006/0060297 A1 | 3/2006 | Lee et al. | |
| 2007/0159086 A1* | 7/2007 | Yu et al. | 313/506 |

FOREIGN PATENT DOCUMENTS

| | | |
|---|---|---|
| EP | 1099744 A2 | 5/2001 |
| EP | 0 903 965 | 7/2003 |
| JP | 60-075864 A | 4/1985 |
| JP | 19920255692 A | 9/1992 |
| JP | 08-259938 | 10/1996 |
| JP | 09-306669 | 11/1997 |
| JP | 10-012384 | 1/1998 |
| JP | 2001167881 A | 6/2001 |
| JP | 2002-0040670 A | 2/2002 |
| JP | 2002-0072491 A | 3/2002 |
| JP | 2004-0127794 A | 4/2002 |
| JP | 2002-302757 A | 10/2002 |
| JP | 2003-519432 | 6/2003 |
| JP | 20030249379 A | 9/2003 |
| JP | 2003-331662 | 11/2003 |
| JP | 2003332221 | 11/2003 |
| JP | 2005-183045 | 7/2005 |
| JP | 2005345591 | 12/2005 |
| JP | 2006503443 A | 1/2006 |
| KR | 1020000011034 A | 2/2000 |
| KR | 10-2001-0085420 | 9/2001 |
| KR | 10-2006-0027744 | 3/2006 |
| WO | 97-43874 A1 | 11/1997 |
| WO | WO 98/03043 | 1/1998 |
| WO | WO 01/49806 A1 | 7/2001 |
| WO | WO 02/07235 A1 | 1/2002 |
| WO | 2004077533 | 9/2004 |
| WO | WO 2004/111701 | 12/2004 |

* cited by examiner ated Application No. PCT/KR2007/002183, filed on May 3, 2007 that claims priority to Korean Patent Application No. 10-2006-0040640, filed on May 4, 2006 and Korean Patent Application No. 10-2006-0100783, filed Oct. 17, 2006 all of which are hereby incorporated by reference in their entirety.

ORGANIC LIGHT-EMITTING DEVICE HAVING LIGHT-EMITTING PATTERN, METHOD AND APPARATUS FOR PREPARING THE SAME

This application is a 371 national stage entry of International Application No. PCT/KR2007/002183, filed on May 3, 2007 that claims priority to Korean Patent Application No. 10-2006-0040640, filed on May 4, 2006 and Korean Patent Application No. 10-2006-0100783, filed Oct. 17, 2006 all of which are hereby incorporated by reference in their entirety.

TECHNICAL FIELD

The present invention relates to an organic light emitting device, and a method and an apparatus for producing the same. More particularly, the present invention pertains to an organic light emitting device having a light emitting pattern, and a method and an apparatus for producing the same.

This application claims priority from Korean Patent Application Nos. 10-2006-0040640 and 10-2006-0100783 filed on May 4, 2006 and Oct. 17, 2006 in the KIPO, respectively, the disclosure of which is incorporated herein by reference in its entirety.

BACKGROUND ART

An organic light emitting device includes two electrodes and an organic material layer that is interposed between the electrodes, and electrons and holes are injected from two electrodes to the organic material layer, so that a current is converted into visible rays to emit light.

FIG. 1 is a sectional view of a conventional organic light emitting device. With reference to the drawing, the organic light emitting device includes a light emitting layer 50 that is interposed between two electrodes, for example, an anode electrode 20 and a cathode electrode 70. Any one of the two electrodes, for example, the anode electrode 20, is provided on a transparent substrate 10, and light that is emitted from the light emitting layer 50 passes therethrough. The organic light emitting device may further comprise one or more layers that are selected from the group consisting of an electron injecting layer 65, an electron transporting layer 60, a hole transporting layer 45, and a hole injecting layer 40 in order to improve performance.

The organic light emitting device may further include an insulating layer 30 having a predetermined pattern on an electrode on the transparent substrate 10 to separate a light emitting region A) and a non-light emitting region B).

DISCLOSURE OF INVENTION

Technical Problem

It is an object of the present invention to provide a method of easily producing an organic light emitting device having a light emitting pattern by comprising changing a portion or all of functions of predetermined pattern regions of one or more layers of an organic material layer or an electrode, and an organic light emitting device that is produced by using the method.

It is another object of the present invention to provide a method of easily producing an organic light emitting device having a light emitting pattern by changing a portion or all of functions of predetermined pattern regions of one or more layers of an organic material layer or an electrode using DLP (digital light processing), an organic light emitting device that is produced by using the method, and an apparatus used in the method.

Technical Solution

In order to accomplish the above-mentioned objects, the present invention provides a method of producing an organic light emitting device, comprising the steps of preparing a first electrode; forming one or more organic material layers on the first electrode; and forming a second electrode on the organic material layers, wherein the method comprises the step of changing functions of predetermined pattern regions of one or more layers of the organic material layers or the electrodes.

According to an embodiment of the present invention, the changing of the functions of the predetermined pattern regions of one or more layers of the organic material layers or the electrodes may be performed by using DLP (digital light processing).

Furthermore, the present invention provides an organic light emitting device that comprises a first electrode; one or more organic material layers that are disposed on the first electrode; and a second electrode that is disposed on the organic material layers, wherein one or more layers of the organic material layers and the electrodes are layers in which functions of predetermined pattern regions are changed.

Additionally, the present invention provides an apparatus for providing a light emitting pattern to an organic light emitting device, comprising (a) a system control unit which generates a patterning image and controls a system, (b) a UV supplying unit, (c) a DLP system which generates a patterned UV image by using a patterning image signal received from the system control unit and UV received from the UV supplying unit and then radiates the patterned UV image, and (d) a sample unit on which a sample on which the patterned UV image emitted from the DLP system is radiated is mounted.

Advantageous Effects

An organic light emitting device includes a layer that has a partially or wholly changed function in a region corresponding to a predetermined pattern. Thereby, it is possible to easily produce the organic light emitting device that emits light in a predetermined pattern. It is unnecessary to use an additional device to emit light in the pattern, a production process may be simple, and there is an advantage in terms of cost. In particular, in the case of when DLP is used to change the function, it is possible to more easily realize a gray scale and more finely and precisely control the gray scale as compared to the case of when an organic light emitting device that emits light in a predetermined pattern by using a photomask and the like is produced.

Figure 1:
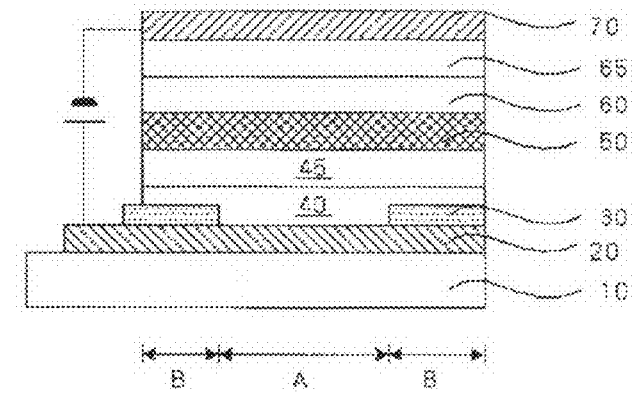
FIG. 1 is a sectional view of a conventional organic light emitting device including a patterned insulating layer.

10; substrate
20; first electrode
30; insulating layer
50; light emitting layer
40, 45, 60, 65; organic material layer other than light emitting layer
70; second electrode

BEST MODE FOR CARRYING OUT THE INVENTION

A detailed description of the present invention will be given hereinafter.

A method of producing an organic light emitting device according to the present invention includes changing functions of predetermined pattern regions of one or more layers of an organic material layer or an electrode in the device so that the organic light emitting device can emit light in a predetermined pattern.

Specifically, a step of changing the functions of predetermined pattern regions of one or more layers of the organic material layer or the electrode may be a step of providing an additional function to the region having the changed function so that the region corresponds to a light emitting region of the organic light emitting device or removing a function from the region so that the region corresponds to a non-light emitting region.

In the present invention, the above-mentioned step is performed so that functions of a predetermined pattern region and the other regions in one or more layers constituting the organic light emitting device are different from each other and the layer containing the regions having the different functions affects the light emitting pattern of the organic light emitting device to force the organic light emitting device to emit light in the predetermined pattern.

Specifically, in the present invention, the layer in which the function of the predetermined pattern region is changed may be selected from the organic material layer or the electrode. In the present invention, in the case of when the layer in which the function of the predetermined pattern region is changed is a charge transporting layer, for example, a layer that injects and/or transports a hole or a layer that injects and/or transports an electron, since the function of the predetermined pattern region of the layer is changed during the above-mentioned step, charge transporting efficiencies of the predetermined pattern region and the other regions are different from each other. Due to a difference in charge transporting efficiency into the light emitting layer, light is emitted from the light emitting layer according to the light emitting pattern that corresponds to the predetermined pattern region of the charge transporting layer.

Additionally, in the case of when the layer in which the function of the predetermined pattern region is changed is the light emitting layer of the organic material layer, the region having the changed function and the region having the unchanged function of the light emitting layer have different light emitting efficiencies, thus forming the light emitting pattern depending on a difference in light emitting efficiency. In the case of when the layer having the changed function of the predetermined pattern region is the electrode, the mechanism is similar.

In the related art, in order to produce the organic light emitting device having the light emitting pattern, it is necessary to form an additional layer, for example, an insulating layer, in addition to the layers constituting the organic light emitting device so that a predetermined pattern is obtained. However, in the present invention, since the above-mentioned step is included, it is unnecessary to form an additional layer or pattern the layer unlike a known process, and the function of only the predetermined pattern region needs to be changed in respects to one or more layers constituting the organic light emitting device so as to easily produce the organic light emitting device having the light emitting pattern. Accordingly, in the present invention, steps of the process may be significantly reduced to increase process efficiency and costs of material and process may be reduced.

In addition to the above-described advantages of the process, the following advantages can be obtained. Since the organic light emitting device that is produced by using a method of producing the organic light emitting device according to the present invention does not include layers other than the layers constituting the organic light emitting device, problems such as deterioration in interlayer interface properties and reduction in light emitting efficiency that may occur when the layers other than the layers constituting the organic light emitting device are provided like the known process may be prevented.

Additionally, in the conventional process using the patterned insulating layer, light emission is 0% and 100% at a portion where the insulating layer is formed and at another portion where the insulating layer is not formed, respectively. In detail, the light emitting pattern is obtained only by using an on/off form. However, in the present invention, the degree of the changing of the functions of the predetermined pattern regions of one or more layers constituting the organic light emitting device is controlled to form a light emitting pattern having a gray scale in which light emission gradually changes from a high light emitting portion via a medium light emitting portion to a low emitting portion, that is, a desirable gradation, as well as an on/off type light emitting pattern.

Furthermore, in the present invention, since various types of methods may be selected as a method of changing the function of the predetermined pattern region of the layer, it is possible to produce an organic light emitting device having a light emitting pattern without a mask unlike the conventional process in which the mask needs to be used to form the patterned insulating layer.

As described above, in the present invention, the layer in which the function of the predetermined pattern region is changed may be one or more layers of the organic material layer. In the case of when the organic light emitting device according to the present invention includes an organic material layer having a multilayered structure, the organic material layer in which the function of the predetermined pattern region is changed may be one or more layers selected from a hole injecting layer, a hole transporting layer, a light emitting layer, an electron transporting layer, and an electron injecting layer, or a layer having two or more functions among the functions of the above-mentioned layers. Alternatively, the organic material layer may be a layer that is additionally formed not to provide the functions but to form the light emitting pattern according to the purpose of the present invention. However, in views of light emitting efficiency, it is more preferable that the organic material layer be a layer for performing charge transportation, for example, hole injection, hole transportation, electron transportation, or electron injection. Furthermore, in the present invention, the layer in which the function of the predetermined pattern region is changed may be an electrode. In this case, the electrode may be applied to an anode, a cathode, or both the anode and the cathode.

In the present invention, a process of changing the functions of the predetermined pattern regions of one or more layers of the organic material layer or the electrode is not limited as long as the purpose is achieved. For example, the process may be performed by means of an optical process, for example processes using UV, a laser, or an e-beam.

In particular, in the case of when DLP is used as a means for changing the functions of the predetermined pattern regions of one or more layers of the organic material layer or the electrode, the functions of the predetermined pattern regions may be finely changed.

The mechanism of the DLP is as follows. The DLP is short for digital light processing and developed by researchers of Texas Instruments, Inc. in the year 1987. In the DLP, an image is processed by using a DMD (digital micromirror device). The DMD may include 750,000 or more micromirrors. Since an image is shown by using the reflecting mirrors, there are advantages in that light efficiency is excellent and a fine image can be obtained.

A digital configuration is advantageous in that a desired image can be precisely obtained with high reliability as compared to an analog configuration and products have a small size and are light in weight. A digital image is a combination of many 0 and 1 signals. A DMD module that is the kernel of the DLP technology may be operated according to the combination of the digital signals. In detail, the combination of digital image signals that are transmitted from video memories or video processors is expressed by operation of the micromirrors constituting the DMD.

Figure 6:
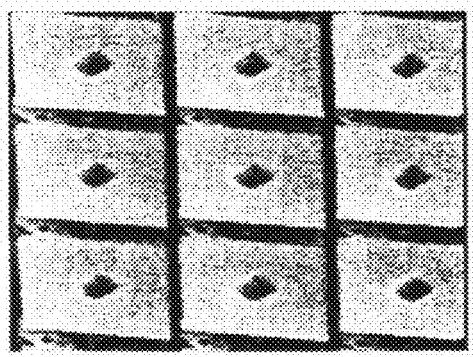
FIG. 6 is a picture illustrating operation of micromirrors that constitute a DMD (digital micromirror device) used to perform DLP by using a microscope.

For example, each of the micromirrors of the DMD module may have the shape of a square having the size of 16 microns× 16 microns, and an interval between the micromirrors may be less than 1 micrometer and the micromirrors may be very densely disposed. Both edges of each of the micromirrors that are contained in the DMD module used to perform the DLP are moved by using the digital signals of 0 and 1 to express digital image signals. Each of the micromirrors may rotate right and left by, for example, 0 to 10°, and the digital image signals that are saved in video memories are transmitted to driving apparatuses of the micromirrors to operate the micromirrors. The rotation of the mirrors is expressed by the fine pixels, and the light and the shade of the pixels are expressed based on the above-mentioned mechanism. The micromirrors that constitute the DMD module used to perform DLP are illustrated in FIG. 6. The size and the rotation angle of the micromirror are given to illustrate, but are not to be construed to limit the present invention.

The DLP is performed according to a mechanism that is similar to that of a card section in a sports stadium. In the card section, a whole image is expressed by using movement of boards. In the DMD, boards are formed of mirrors and, when rays are radiated from a light source at a predetermined position in a predetermined direction, the rays reflect by movement of the mirrors and lens portions through which the rays penetrate and the other portions through which the rays cannot penetrate form a single image.

In the case of when a black-and-white picture is to be formed, a gray tone color sense needs to be expressed in addition to the white and black colors. In the DMD, the color sense may be expressed by using the mechanism of the card section of 0 and 1 that are changed several thousands times per one second. For example, when the DMD mirrors are to be moved 1000 times per unit time, if a frequency of 0 and 1 is finely controlled by using the mirrors, it is possible to very precisely control color tones of pixels. A movement speed of the micromirror of the DMD may be set to 500,000 or more times per second. Thereby, the light and the shade of black and white colors are expressed and a gray scale image may be outputted by using a digital configuration.

Therefore, in the DLP, an energy source may be selectively applied to an organic material layer or an electrode, so that the function of the predetermined pattern region of the organic material layer or the electrode is selectively changed.

Figure 10:
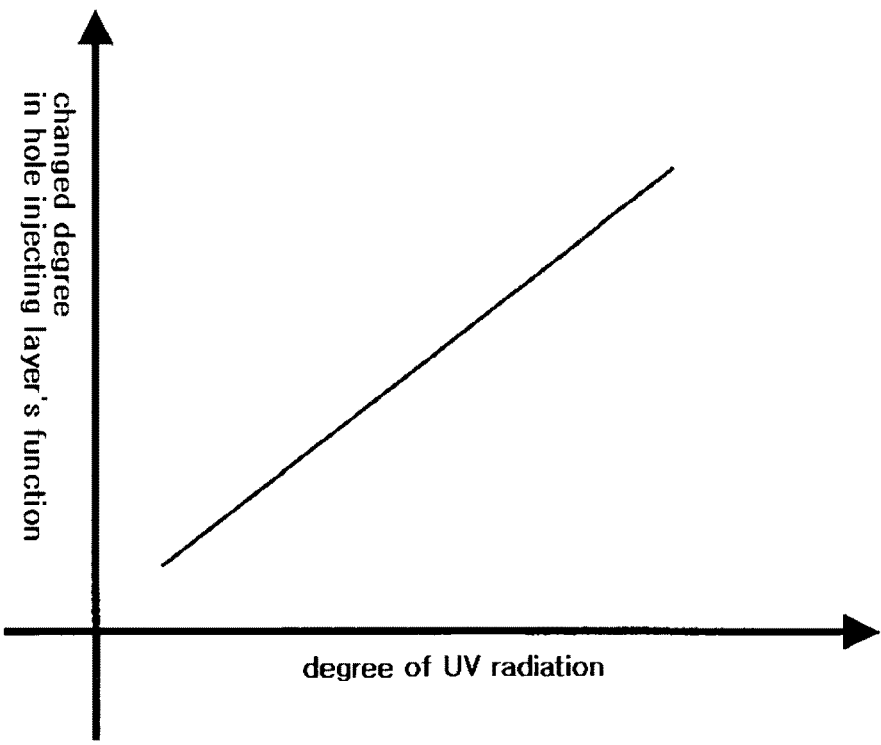
FIG. 10 is a graph illustrating the changed degree in the function of the organic material layer according to the degree of UV radiation.

For example, the organic material layer in which the function is capable of being changed by using the above-mentioned optical method may be a layer that includes the compound represented by Formula 1. The compound of Formula 1 may function to inject and/or transport a hole in the organic light emitting device, but the injecting and/or transporting functions of the region that is treated by the above-mentioned optical method may be partially or totally removed. FIG. 10 is a graph illustrating change of the function of the organic material layer including the compound of Formula 1 according to radiation of UV.

[Formula 1]

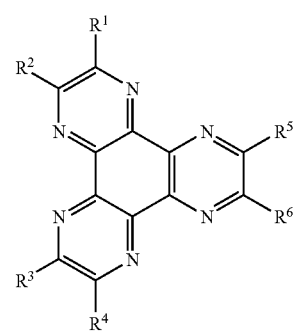

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight- or branched-chained $C_1$-$C_{12}$ alkoxy, substituted or unsubstituted straight- or branched-chained $C_1$-$C_{12}$ alkyl, a substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted $C_1$-$C_{60}$ alkyl, substituted or unsubstituted aryl, and a substituted or unsubstituted five- to seven-membered hetero ring.

The compound of Formula 1 may be selected from the compounds represented by Formulae 1-1 to 1-6.

[Formula 1-1]

[Formula 1-2]

[Formula 1-3]

[Formula 1-4]

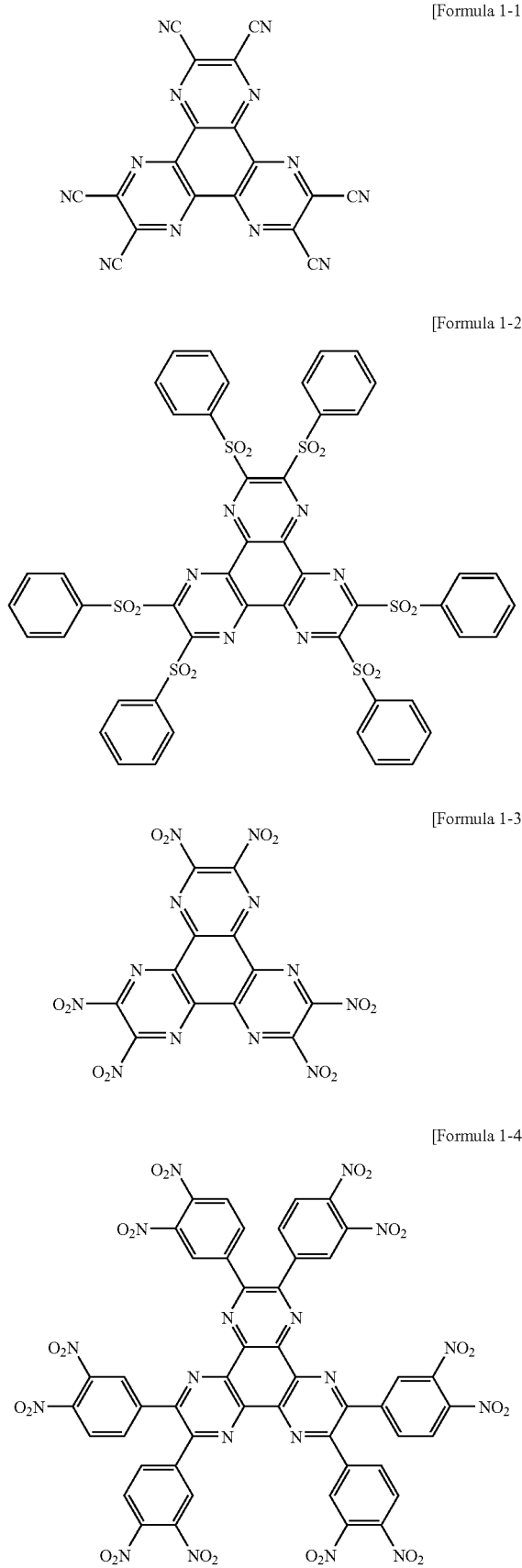

[Formula 1-5]

[Formula 1-6]

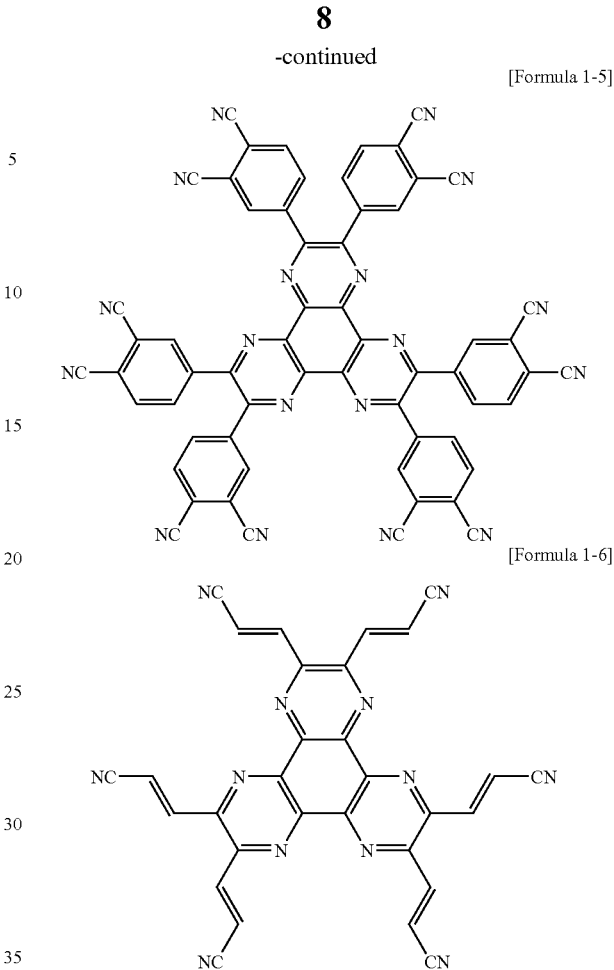

In the present invention, the step of changing the functions of the predetermined pattern regions of one or more layers of the organic material layer or the electrode may be performed after the other organic material layers are formed or after the second electrode is formed, as long as after the layer in which the function of the predetermined pattern region is changed is formed. However, preferably, the step is performed after the layer in which the functions of the predetermined pattern regions are to be changed is formed and before the other organic material layers or the second electrodes are formed.

Figure 2:
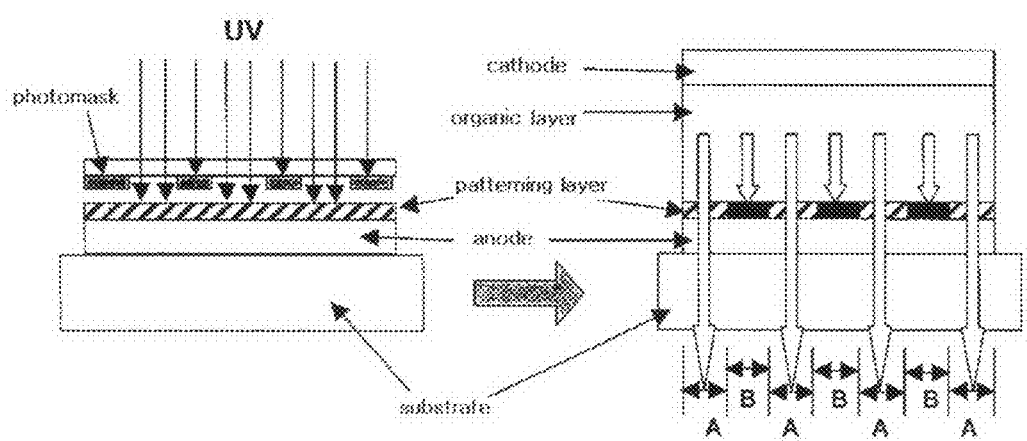
FIG. 2 is a sectional view illustrating changing of functions of a predetermined pattern region of a specific organic material layer due to exposure according to an embodiment of the present invention.
Figure 3:
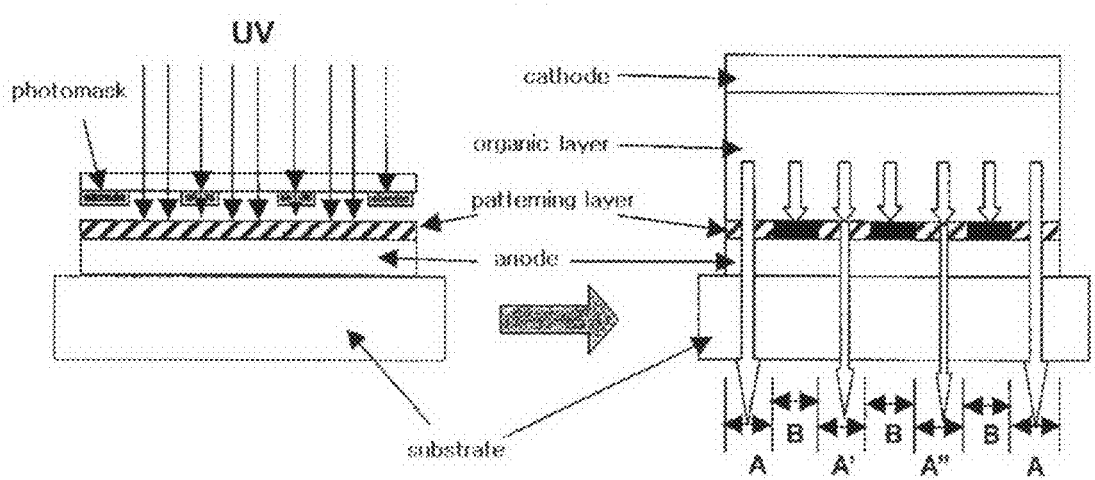
FIG. 3 is a sectional view illustrating separately controlling of exposure of regions to change functions of a predetermined pattern region of a specific organic material layer.

Furthermore, the step of changing the functions of the predetermined pattern regions of one or more layers of the organic material layer or the electrode may be performed so that the organic light emitting device realizes on/off or various types of light emitting gradations by controlling the degree of the changing of the functions according to the position of the pattern region, for example, by controlling exposure in the case of when the optical method is used. For example, all of the functions of the predetermined pattern regions are changed to form a light emitting pattern so that the intensity of emitted light is expressed by an on/off form at the region where the functions are changed and the region where the functions are not changed. Furthermore, exposure may be controlled according to the position of the pattern region so that the degree of changing of the functions varies, thus forming the light emitting pattern having two different intensities of emitted light. An example relating to this is illustrated in FIGS. 2 and 3. In FIG. 2, UV is radiated on the non-light emitting region to completely remove the function of the region, so that the produced organic light emitting device displays two intensities of emitted light of the light emitting region A and the non-light emitting region B, that is, on/off intensities. In FIG. 3, photomasks that are capable of controlling radiation of UV according to the position of regions are used. Thus, the degree of changing of the functions of the pattern regions varies so that the organic light emitting device has various types of light emitting intensities. In FIGS. 3, A, A', and A" that denote the intensities of emitted light of the light emitting regions and B that denotes the intensity of emitted light of the non-light emitting region may have the different degrees of brightness. In addition, the step of changing the functions of the pattern regions may be performed through a single stage or through multiple stages to change at least a portion of functions of the different pattern regions.

In order to ensure the light emitting pattern where the gradation is expressed, photomasks having various types of materials or thicknesses may be used or exposure may be controlled to adjust exposure according to the type of region. For example, in order to express a pattern having three or more different intensities of emitted light, a photomask that is made of various types of materials or has various thicknesses and is capable of controlling permeation of light according to the region may be used, a plurality of photomasks that is made of various types of materials or has various thicknesses may be used, or a light source that is capable of controlling radiation of light according to the region may be used.

Figure 5:
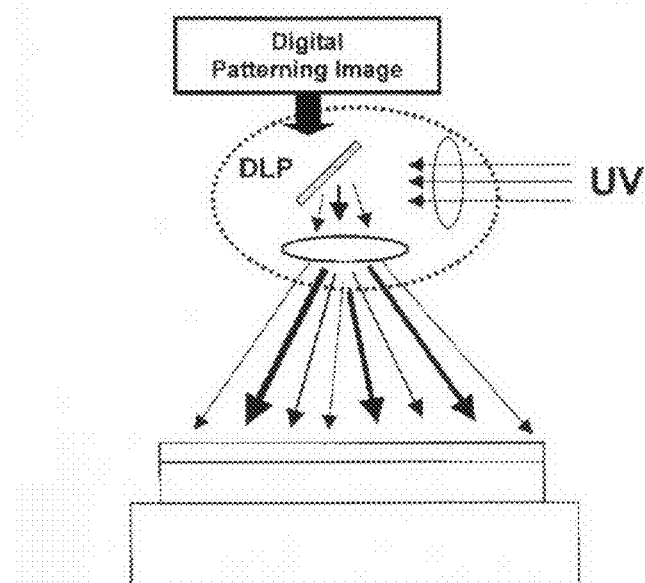
FIG. 5 is a sectional view illustrating separately controlling of exposure of regions by using DLP to change the function of an organic material layer according to the shape of a digital patterning image.

FIG. 5 illustrates the change in function that is controlled by using the DLP. The controlling is performed based on the above mechanism. In the case of when the DLP is used, all of the functions of the predetermined pattern regions may be changed to ensure the light emitting pattern where the intensity of emitted light is expressed in the on/off form at the region where the functions are changed and at the region where the functions are not changed. Furthermore, exposure may be controlled according to the type of region so that the degree of the changing of the functions varies. Thereby, it is possible to ensure the light emitting pattern so that two or more different intensities of emitted light are obtained.

The organic light emitting device according to the present invention may be produced by using a typical method of producing an organic light emitting device and a typical material, except that the functions of the predetermined pattern regions of one or more constituent layers are changed. For example, metal or metal oxide having conductivity or an alloy thereof is deposited on a substrate by using a PVD (physical vapor deposition) process such as sputtering or e-beam evaporation to form an anode, an organic material layer that includes a hole injecting layer, a hole transporting layer, a light emitting layer, and an electron transporting layer is formed, and a material that is capable of being used to form a cathode is deposited to produce the organic light emitting device according to the present invention. Alternatively, a cathode material, an organic material layer material, and an anode material may be sequentially deposited on the substrate in order to produce an organic light emitting device having an inverted structure.

The organic material layer may be produced by means of a solvent process, not a deposition process, using various types of polymer materials, for example, spin coating, dip coating, doctor blading, screen printing, inkjet printing, or heat transcription so as to include a small number of layers.

In addition, the present invention provides an organic light emitting device that is produced by using the production method. The organic light emitting device includes a first electrode, one or more organic material layers that are disposed on the first electrode, and a second electrode that is disposed on the organic material layers, wherein one or more layers of the organic material layers or the electrodes are layers in which functions of predetermined pattern regions are changed. The organic light emitting device according to the present invention may have a light emitting pattern having gradation that is not obtained in the case of when the pattern is formed by using the insulating layer. The layer in which the function of the predetermined pattern region is changed may be a layer which has an additional function to correspond to the light emitting region of the organic light emitting device or from which the function is removed to correspond to the non-light emitting region.

The organic light emitting device of the present invention may have a typical structure, except that the organic light emitting device has an organic material layer where at least a portion of the functions of the predetermined pattern regions is changed. The organic material layer of the organic light emitting device of the present invention may have a single-layered structure including one layer or a multilayered structure having two or more layers including the light emitting layer. In the case of when the organic material layer of the organic light emitting device of the present invention has the multilayered structure, the organic material layer may have a structure that includes a hole injecting layer, a hole transporting layer, a light emitting layer, and an electron transporting layer. However, the structure of the organic light emitting device is not limited thereto, but the organic light emitting device may include a smaller number of organic material layers. Furthermore, in the present invention, the layer in which the functions of the predetermined pattern regions are changed may be an electrode. In this case, the electrode may be applied to an anode, a cathode, or both the anode and the cathode. The organic light emitting device of the present invention may be an organic light emitting device having a normal structure or an organic light emitting device having an inverted structure. Additionally, the organic light emitting device according to the present invention may be classified into a top light emitting type, a bottom light emitting type, or a dual-sided light emitting type according to the type of used material.

Furthermore, the present invention provides an apparatus for providing a light emitting pattern to an organic light emitting device, comprising (a) a system control unit which generates a patterning image and controls a system, (b) a UV supplying unit, (c) a DLP system which generates a patterned UV image by using a patterning image signal received from the system control unit and UV received from the UV supplying unit and then radiates the patterned UV image, and (d) a sample unit on which a sample on which the patterned UV image emitted from the DLP system is radiated is mounted.

Figure 7:
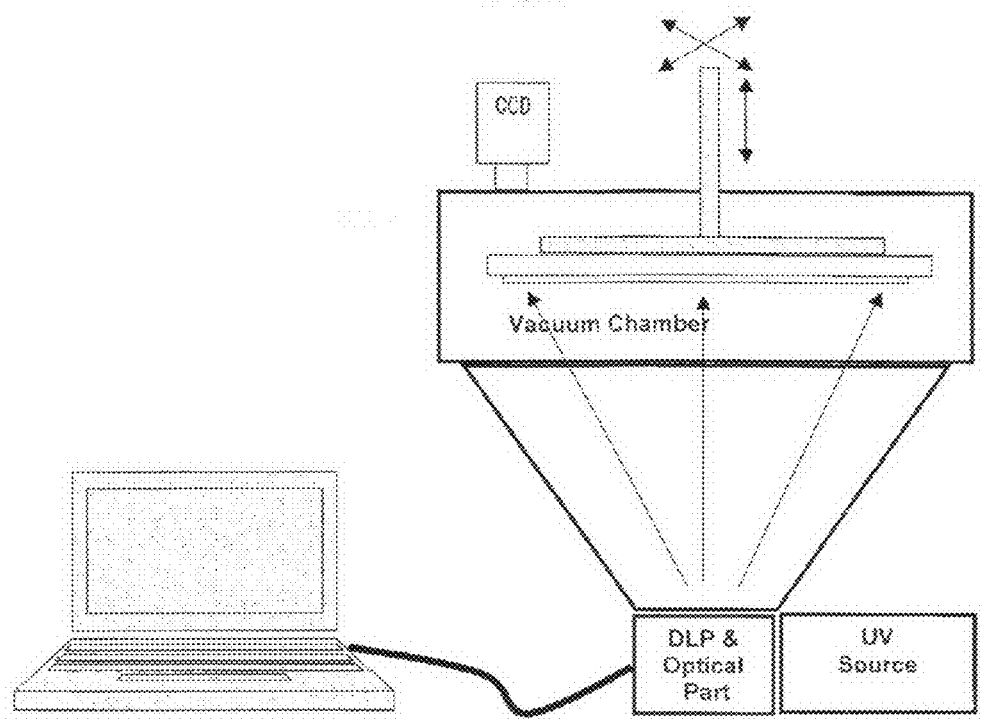
FIG. 7 is a view schematically illustrating an apparatus using the DLP.

The system control unit (a) is a part that forms an image to be patterned and controls an entire system of the device, and may include a computer as shown in FIG. 7. The system control unit may receive an alignment key signal from the sample unit to control alignment system operation of the sample unit so that the shape of pattern is set on the sample in the sample unit.

The UV supplying unit (b) is a unit in which UV is radiated on a DLP system. The UV supplying unit may include a UV lamp and a UV lamp power supply. Furthermore, the feedback on the intensity of UV that is radiated on the sample may be provided to maintain the intensity of UV.

The DLP system (c) functions to receive an image signal that is to be patterned from the system control unit (a), force the unpatterned UV that is emitted from the UV supplying unit (b) to form a patterned UV image, and radiate the resulting patterned UV image on the sample provided in the sample unit. The DLP system may include the above-mentioned DMD.

The sample unit (d) may include a vacuum chamber at a part on which the sample is mounted. The sample unit may include an alignment system aligning the patterns so as to ensure a predetermined shape and a sensor for measuring the intensity of UV.

Figure 8:
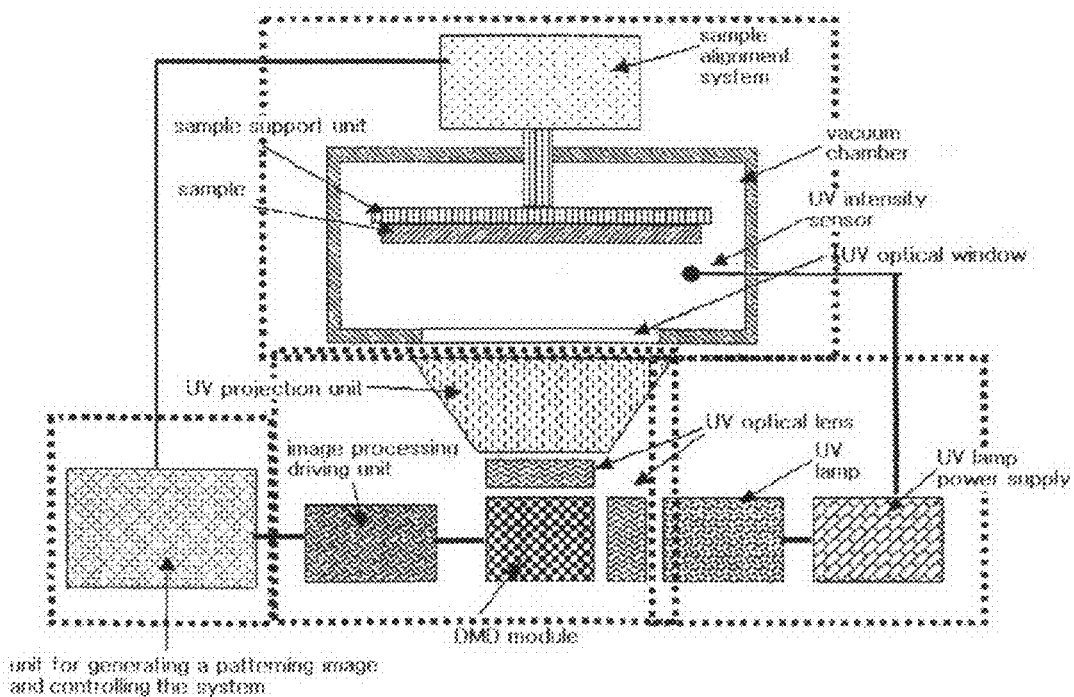
FIG. 8 is a detailed view illustrating the apparatus using the DLP.

An apparatus that provides the light emitting pattern to the organic light emitting device will be described with reference to FIG. 8. However, FIG. 8 is set forth to illustrate, but are not to be construed to limit the present invention.

In the apparatus according to the present invention, the UV supplying unit (b) may include a UV lamp power supply and a UV lamp that is operated by power supplied from the UV lamp power supply.

The DLP system (c) may include an image processing driving unit which receives a patterning image signal from the system control unit (a) and converts the patterning image signal into a digital image signal; a DMD module which receives an image signal from the image processing driving unit and forms a patterned UV image by using UV supplied from the UV supplying unit (b); a UV projection unit which radiates the patterned UV image supplied from the DMD module on the sample unit; a UV optical lens which is disposed between the UV supplying unit (b) and the DMD module; and a UV optical lens which is disposed between the DMD module and the UV projection unit.

The sample unit (d) may include a sample support unit; a vacuum chamber which includes a UV optical window provided in a region corresponding to the UV projection unit of the DLP system (c); a UV intensity sensor which is connected to a UV lamp power supply of the UV supplying unit (b); and a sample alignment system which is connected to the sample support unit and the system control unit (a).

Figure 9:
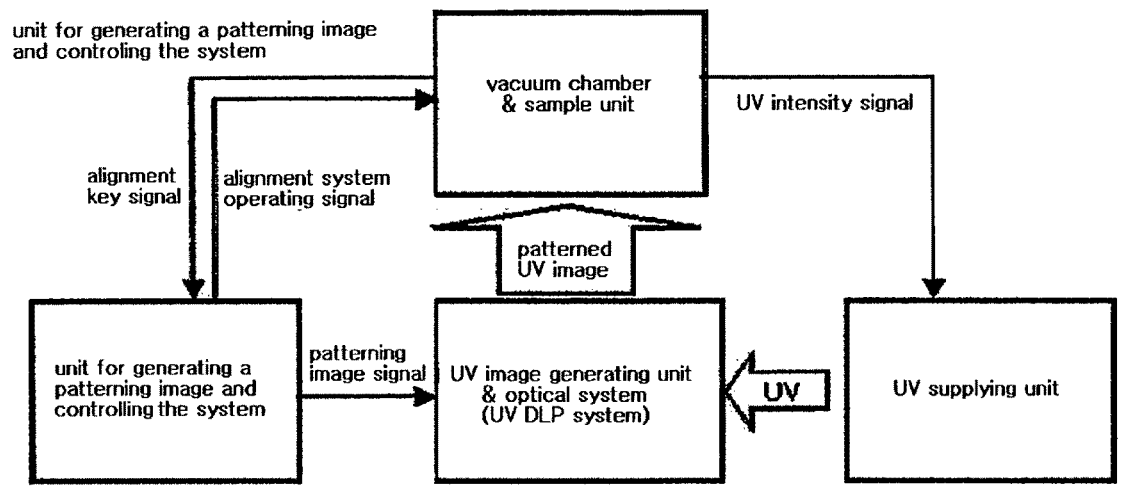
FIG. 9 is a view schematically illustrating an operation mechanism of the apparatus using the DLP.

Specifically, the apparatus that provides the light emitting pattern to the organic light emitting device according to the present invention is operated by using the following method. The system control unit receives an alignment key signal for aligning the pattern on the sample to generate a patterning image and then transmits the patterning image to an image processing driving unit. The image processing driving unit converts a patterning image signal into a digital image signal and transmits the digital image signal to a DMD module. The UV supplying unit supplies unpatterned UV that has a predetermined intensity through a UV optical film to the DMD module. The DMD module receives the digital image signal and unpatterned UV, converts UV into a patterned UV image, and radiates the UV image through a UV optical film, a UV projection unit, and a UV optical window on the sample mounted on the sample unit including the vacuum chamber. The sample alignment system of the sample unit receives the alignment key signal in order to align the pattern on the sample and transmits the alignment key signal to the system control unit, so that the system control unit controls driving of the alignment system. A UV intensity sensor of the sample unit is used to measure the intensity of UV and transmit the measured signal to the UV power supply to control the intensity of UV. A driving mechanism of the apparatus that provides the light emitting pattern to the organic light emitting device is illustrated in FIG. 9.

MODE FOR THE INVENTION

A better understanding of the present invention may be obtained in light of the following Examples which are set forth to illustrate, but are not to be construed to limit the present invention.

Example 1

The glass substrate that was thinly coated with ITO (indium tin oxide) to a thickness of 1500 Å was immersed in distilled water in which a detergent was dissolved and washed with a ultrasonic wave. After ITO was washed for 30 min, the ultrasonic wave washing was repeated twice by using distilled water for 10 min. After the washing using distilled water was finished, the ultrasonic wave washing was performed by using a solvent including as isopropyl alcohol, acetone, or methanol, dried, and transported to a plasma washing machine. Additionally, the substrate was washed by using an oxygen plasma for 5 min and then transported to a vacuum deposition machine.

Hexanitrile hexaazatriphenylene (HAT) of the following formula was deposited on the prepared ITO transparent electrode in a vacuum by heating to a thickness of 100 Å to form the hole injecting layer, the pattern mask made of soda lime covered the resulting layer, and UV was radiated thereon by using a high pressure mercury UV lamp having a capacitance of 1 kW for about 5 min.

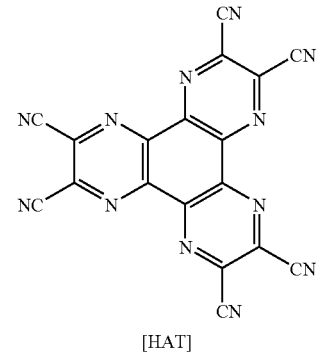

[HAT]

The substance that was used to transport a hole, 4,4'-bis[N-(1-naphthyl)-N-phenylamino]biphenyl (NPB) (400 Å) was deposited on the hole injecting layer in a vacuum to form a hole transporting layer. Subsequently, an Alq3 light emitting substance of the following formula was deposited on the hole transporting layer in a vacuum to form a light emitting layer.

[Alq3]

The following compound was deposited on the light emitting layer in a vacuum to a thickness of 200 Å to form an electron injecting and transporting layer.

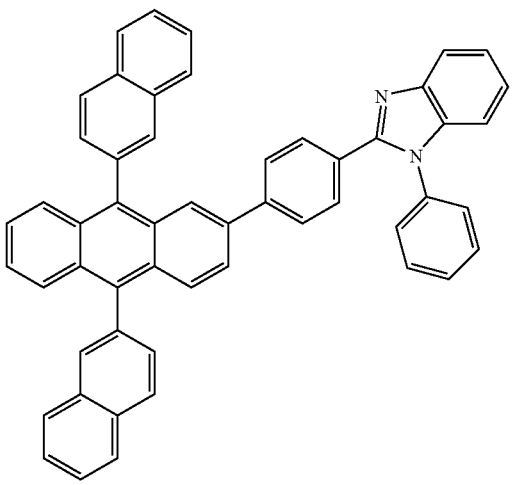 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

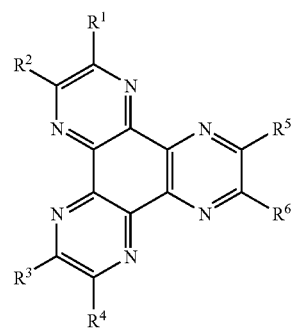

[Formula 1]

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight- or branched-chained $C_1$-$C_{12}$ alkoxy, substituted or unsubstituted straight- or branched-chained $C_1$-$C_{12}$ alkyl, a substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted $C_1$-$C_{60}$ alkyl, substituted or unsubstituted aryl, and a substituted or unsubstituted five- to seven-membered hetero ring.

Lithium fluoride (LiF) and aluminum were sequentially deposited on the electron injecting and transporting layer to a thickness of 12 Å and 2000 Å, respectively, to form a cathode.

In this connection, the deposition rate of the organic substance was maintained at 0.4 to 0.7 Å/sec, the deposition rate of lithium fluoride of the cathode was maintained at 0.3 Å/sec, the deposition rate of aluminum was maintained at 2 Å/sec, and the degree of vacuum was maintained at $2\times10^{-7}$ to $5\times10^{-8}$ torr during the deposition.

Figure 4:
FIG. 4 illustrates a light emitting pattern of the device that is produced in Example 1.

In the case of when a forward electric field of 5.7 V was applied to the organic light emitting device to emit light, light emitting properties were changed at a portion where properties of the organic substance were changed due to exposure to UV, thereby forming a predetermined pattern. This is illustrated in FIG. 4.

The invention claimed is:

1. A method of producing an organic light emitting device, comprising the steps of preparing a first electrode; forming one or more organic material layers on the first electrode; and forming a second electrode on the organic material layers, wherein the method comprises the step of changing functions of predetermined pattern regions of one or more layers of the organic material layers,
wherein the layers in which the functions of the predetermined pattern regions are changed comprise an organic material layer which has one or more functions selected from the group consisting of hole injecting and hole transporting,
wherein the changing of the functions of the predetermined pattern regions of one or more layers of the organic material layers includes controlling exposure according to the type of regions to adjust the degree of changing of functions of an organic substance so that the organic light emitting device expresses two or more intensities of emitted light so as to express gray scale image,
wherein the changing of the functions of the predetermined pattern regions of one or more layers of the organic material layers includes removing the functions from the regions so that each of the regions where the functions are changed corresponds to a non-light emitting region, and
wherein the layers in which the functions of the predetermined pattern regions are changed comprise an organic material layer containing a compound represented by Formula 1:

2. The method according to claim 1, wherein the changing of the functions of the predetermined pattern regions of one or more layers of the organic material layers is performed by using an optical process.

3. The method according to claim 2, wherein the changing of the functions of the predetermined pattern regions of one or more layers of the organic material layers is performed by using radiation of UV, a laser, or an e-beam or using DLP (digital light processing).

4. The method according to claim 1, wherein the changing of the functions of the predetermined pattern regions of one or more layers of the organic material layers is performed after the layers where the functions of the predetermined pattern regions are changed are formed and before the other layers are formed.

5. The method according to claim 1, wherein the controlling of exposure is performed by using a process of controlling permeation of a photomask or a process of controlling the intensity of light of a light source.

6. An organic light emitting device comprising
a first electrode;
one or more organic material layers that are disposed on the first electrode; and
a second electrode that is disposed on the organic material layers,
wherein one or more layers of the organic material layers are layers in which functions of predetermined pattern regions are changed,
wherein each of the layers in which the functions of the predetermined pattern regions are changed has one or more functions selected from the group consisting of hole injecting and hole transporting,
wherein when the functions are changed in the layers in which the functions of the predetermined pattern regions are to be changed, exposure is controlled according to the type of regions to adjust the degree of changing of functions of an organic substance so that the organic light emitting device expresses two or more intensities of emitted light so as to express a gray scale image, wherein each of the layers in which the functions of the predetermined pattern regions are changed is a layer from which the functions are removed so as to correspond to a non-light emitting region, and wherein the layers in which the functions of the predetermined pattern regions are changed comprise an organic material layer containing a compound represented by Formula 1:

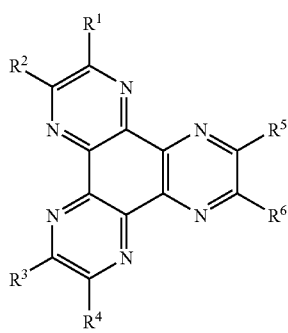

[Formula 1]

wherein $R^1$ to $R^6$ are each selected from the group consisting of hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight- or branched-chained $C_1$-$C_{12}$ alkoxy, substituted or unsubstituted straight- or branched-chained $C_1$-$C_{12}$ alkyl, a substituted or unsubstituted aromatic or nonaromatic hetero ring, substituted or unsubstituted aryl, substituted or unsubstituted mono- or di-arylamine, and substituted or unsubstituted aralkylamine, and R and R' are each selected from the group consisting of substituted or unsubstituted $C_1$-$C_{60}$ alkyl, substituted or unsubstituted aryl, and a substituted or unsubstituted five- to seven-membered hetero ring.

7. The organic light emitting device according to claim 6, wherein each of the layers in which the functions of the predetermined pattern regions are changed has the functions changed by using an optical process.

8. The organic light emitting device according to claim 6, wherein each of the layers in which the functions of the predetermined pattern regions are changed has the functions changed by using UV, a laser, or an e-beam or using DLP (digital light processing).

9. An electronic apparatus comprising the organic light emitting device according to claim 6.

10. An apparatus for providing a light emitting pattern to an organic light emitting device according to claim 6, comprising:
(a) a system control unit which generates a patterning image and controls a system;
(b) a UV supplying unit;
(c) a DLP system which generates a patterned UV image by using a patterning image signal received from the system control unit and UV received from the UV supplying unit and then radiates the patterned UV image; and
(d) a sample unit on which a sample on which the patterned UV image emitted from the DLP system is radiated is mounted.

11. The apparatus according to claim 10, wherein the DLP system (c) comprises an image processing driving unit which receives a patterning image signal from the system control unit (a) and converts the patterning image signal into a digital image signal; a DMD module which receives an image signal from the image processing driving unit and forms a patterned UV image by using UV supplied from the UV supplying unit (b); a UV projection unit which radiates the patterned UV image supplied from the DMD module on the sample unit; a UV optical lens which is disposed between the UV supplying unit (b) and the DMD module; and a UV optical lens which is disposed between the DMD module and the UV projection unit.

12. The apparatus according to claim 10, wherein the sample unit (d) includes a sample support unit; a vacuum chamber which comprises a UV optical window provided in a region corresponding to the UV projection unit of the DLP system (c); a UV intensity sensor which is connected to a UV lamp power supply of the UV supplying unit (b); and a sample alignment system which is connected to the sample support unit and the system control unit (a).

* * * * *